(12) United States Patent  
Shino

(10) Patent No.: US 7,208,799 B2
(45) Date of Patent: Apr. 24, 2007

(54) FLOATING BODY CELL DYNAMIC RANDOM ACCESS MEMORY WITH OPTIMIZED BODY GEOMETRY

(75) Inventor: Tomoaki Shino, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/824,535

(22) Filed: Apr. 15, 2004

(65) Prior Publication Data

US 2005/0133843 A1 Jun. 23, 2005

(30) Foreign Application Priority Data

Nov. 21, 2003 (JP) ............... 2003-392342

(51) Int. Cl.
*H01L 29/06* (2006.01)
(52) U.S. Cl. .................. 257/347; 257/E29.17
(58) Field of Classification Search ............. 257/300, 257/347, 905–908, E27.084, E27.646, 66, 257/68, 296
See application file for complete search history.

(56) References Cited

U.S. PATENT DOCUMENTS

| | | | |
|---|---|---|---|
| 5,784,311 A * | 7/1998 | Assaderaghi et al. | 365/150 |
| 6,538,916 B2 | 3/2003 | Ohsawa | |
| 6,617,651 B2 * | 9/2003 | Ohsawa | 257/366 |
| 6,703,673 B2 * | 3/2004 | Houston | 257/407 |
| 2003/0015757 A1 * | 1/2003 | Ohsawa | 257/365 |
| 2004/0026749 A1 * | 2/2004 | Ohsawa | 257/390 |

FOREIGN PATENT DOCUMENTS

| | | |
|---|---|---|
| JP | 2002-246571 | 8/2002 |
| JP | 2003-17691 | 1/2003 |
| JP | 2003-31693 | 1/2003 |
| JP | 2003-31696 | 1/2003 |
| JP | 2003-188251 | 7/2003 |

OTHER PUBLICATIONS

Kazumi Inoh, et al., "FBC (Floating Body Cell) for Embedded DRAM on SOI", Symposium on VLSI Technology Digest of Technical Papers, 2003, pp. 63-64.
Takashi Ohsawa, et al., "Memory Design Using a One-Transistor Gain Cell on SOI", IEEE Journal of Solid-State Circuits, vol. 37, No. 11, Nov. 2002, pp. 1510-1522.

* cited by examiner

*Primary Examiner*—Douglas W. Owens
*Assistant Examiner*—Andrew O Arena
(74) *Attorney, Agent, or Firm*—Oblon, Spivak, McClelland, Maier & Neustadt, P.C.

(57) ABSTRACT

A semiconductor device includes a semiconductor substrate; a first insulation layer formed on the semiconductor substrate; a semiconductor layer insulated from the semiconductor substrate by the insulation layer; a source region of a first conduction type and a drain region of the first conduction type formed in the semiconductor layer; a body region of a second conduction type formed in the semiconductor layer between the source region and the drain region, said body region being capable of storing data by accumulating or releasing electric charge; a second insulation layer formed on the body region; a word line formed on the second insulation layer and insulated from the body region by the second insulation layer; and a bit line electrically connected to the drain region, wherein the area of the body region in contact with the first insulation layer is larger than the area thereof in contact with the second insulation layer.

5 Claims, 10 Drawing Sheets

FLOATING BODY CELL DYNAMIC RANDOM ACCESS MEMORY WITH OPTIMIZED BODY GEOMETRY

CROSS-REFERENCE TO RELATED APPLICATIONS

This application is based upon and claims the benefit of priority from the prior Japanese Patent Application No. 2003-392342, filed on Nov. 21, 2003, the entire contents of which are incorporated herein by reference.

BACKGROUND OF THE INVENTION

1. Field of the Invention

The present invention relates to a semiconductor device and a method of manufacturing a semiconductor device.

2. Related Background Art

Semiconductor storage devices including DRAMs are more and more down-scaled in recent years. 1T-1C (1 transistor-1 capacitor) type DRAMs, however, need a certain area for capacitors to secure the storage capacitance of the capacitors. Therefore, 1T-1C DRAMs have a scaling limitation. Further, since 1T-1C DRAMs need capacitors, their manufacturing process is complicated, increasing their manufacturing cost.

To cope with this problem, techniques for forming DRAMs on an SOI (silicon on insulator) substrate have been developed. For example, Japanese Patent Laid Open Publication No. JP-2002-246571 (herein below referred to as Patent Document 1) discloses a DRAM comprising FBCs (Floating Body Cells). The FBC is a memory cell composed of one transistor using an SOI substrate.

The FBC is formed as a MOS transistor on an SOI substrate. Its SOI layer includes a source region, drain region and body region. The body region confined between the source region and the drain region is electrically floating.

The drain current varies with the number of holes in the body region. Data "1" and data "0" can be distinguished by the grade of change of the drain current. That is, by controlling the number of holes accumulated in the body region, the FBC can store data. For example, when more holes exist in the body region, the FBC identifies the data as "1". When fewer holes exist in the body region, the FBC identifies the data as "0". In this type of the FBC, in general, the larger the capacitance between the body region and a fixed potential element such as a support substrate, the data retention time is longer, and the function yield is better.

The FBC described in Patent Document 1 increases the capacitance between the body region and the support substrate by using an SOI substrate having a thin buried oxide film (herein below referred as BOX layer).

However, simply thinning the BOX layer invites an increase of the parasitic capacitance between the SOI layer region and the support substrate in peripheral circuits and logic circuits. Increase of the parasitic capacitance decreases the speed of peripheral circuits and logic circuits, and increases their power consumption.

Therefore, the larger the better the capacitance between the body region and the support substrate in the region where an FBC is formed whereas the smaller the better the parasitic capacitance between the SOI layer region and the support substrate in the region where peripheral circuits and logic circuits are formed.

SUMMARY OF THE INVENTION

A semiconductor device of an embodiment according to the invention comprises a semiconductor substrate; a first insulation layer formed on the semiconductor substrate; a semiconductor layer insulated from the semiconductor substrate by the insulation layer; a source region of a first conduction type and a drain region of the first conduction type formed in the semiconductor layer; a body region of a second conduction type formed in the semiconductor layer between the source region and the drain region, said body region being capable of storing data by accumulating or releasing electric charge; a second insulation layer formed on the body region; a word line formed on the second insulation layer and insulated from the body region by the second insulation layer; and a bit line electrically connected to the drain region, wherein the area of the body region in contact with the first insulation layer is larger than the area thereof in contact with the second insulation layer.

A semiconductor device of a further embodiment according to the invention comprises a semiconductor substrate; a first insulation layer formed on the semiconductor substrate; a semiconductor layer insulated from the semiconductor substrate by the insulation layer; a source region of a first conduction type and a drain region of the first conduction type formed in the semiconductor layer; a body region of a second conduction type formed between the source region and the drain region in the semiconductor layer, said body region being capable of storing data by accumulating or releasing electric charge; a second insulation layer formed on the body region; a word line formed on the second insulation layer and insulated from the body region by the second insulation layer; and a bit line electrically connected to the drain region, wherein the first insulation layer has a thickness equal to or less than five times the thickness of the second insulation layer.

A semiconductor device of a further embodiment according to the invention comprises a semiconductor substrate; a first insulation layer formed on the semiconductor substrate; a semiconductor layer insulated from the semiconductor substrate by the insulation layer; a source region of a first conduction type and a drain region of the first conduction type formed in the semiconductor layer; a body region of a second conduction type formed in the semiconductor layer between the source region and the drain region, said body region being capable of storing data by accumulating or releasing electric charge; a second insulation layer formed on the body region; a word line formed on the second insulation layer and insulated from the body region by the second insulation layer; and a bit line electrically connected to the drain region, wherein the body region has a thickness equal to or less than three times the thickness of the first insulation layer.

A method of manufacturing a semiconductor device of an embodiment according to the invention comprises: preparing an SOI substrate having a semiconductor layer insulated from a support substrate by a first insulation layer; forming a mask material on the semiconductor layer; patterning the mask material; etching the semiconductor layer in accordance with the mask material and thereby partly exposing the first insulation layer; implanting an impurity into the support substrate in an energy level permitting the impurity to penetrate the exposed part of the first insulation layer but not permitting the same to penetrate the mask material; forming a third insulation layer between adjacent portions of the semiconductor layer; removing the mask material; forming a gate insulating layer on the semiconductor layer;

forming a gate electrode on the gate insulating layer; and forming a source region and a drain region in the portions of the semiconductor layer at both sides of the gate electrode.

A method of manufacturing a semiconductor device of a further embodiment according to the invention comprises: preparing an SOI substrate having a semiconductor layer insulated from a support substrate by a first insulation layer; forming a mask material on the semiconductor layer; patterning the mask material; etching an upper lying part of the semiconductor layer in accordance with the mask material while maintaining the remainder lower part of the semiconductor layer; forming a spacer on side surface of the mask material and on side surface of the upper lying part of the semiconductor layer; etching the semiconductor layer by using the mask material and the spacer as a mask, and thereby partly exposing the first insulation layer; forming a third insulation layer between adjacent portions of the semiconductor layer; removing the mask material; forming a gate insulating layer on the semiconductor layer; forming a gate electrode on the gate insulating layer; and forming a source region and a drain region in the portion of the semiconductor layer at both sides of the gate electrode.

DETAILED DESCRIPTION OF THE INVENTION

Some embodiments of the invention will now be explained below with reference to the drawings. These embodiments should not be construed to limit the invention.

The body region of FBC in DRAM according to one of the embodiments is in contact with a BOX layer over an area wider than the area thereof in contact with the gate insulating film. This configuration assures a larger capacitance between the body region and a fixed potential than that of a conventional technique. More preferably, thickness of the BOX layer between the support substrate and the body region is five times of the gate insulating film in maximum. Then, the capacitance between the body region and the fixed potential increases further.

First Embodiment

Figure 1:
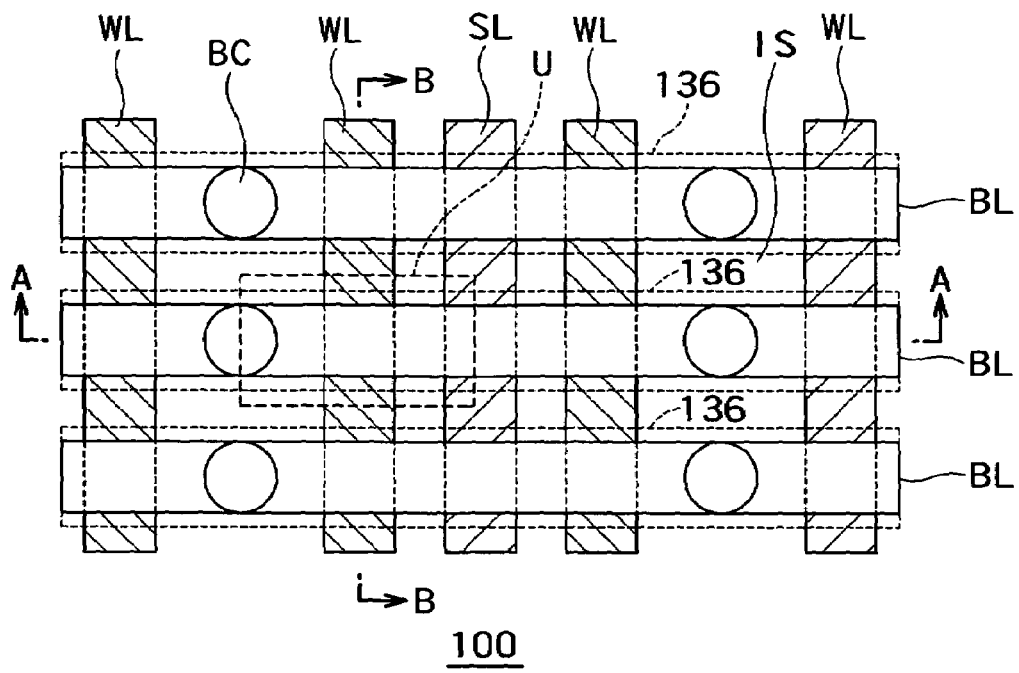
FIG. 1 is a plan view of DRAM 100 according to the first embodiment of the invention.

FIG. 1 is a plan view of DRAM 100 according to the first embodiment of the invention. In this embodiment, a peripheral circuit for controlling the DRAM 100 may be provided around the DRAM 100. The DRAM 100 includes word lines WL, bit lines BL and source lines SL. The word lines WL and the source lines SL extend approximately in parallel whereas the bit lines BL extend in directions approximately perpendicular to the word lines WL and the source lines SL. Bit contacts BC make electrical connection between the bit lines BL and the drain regions below the bit lines BL (see FIG. 2).

Figure 2:
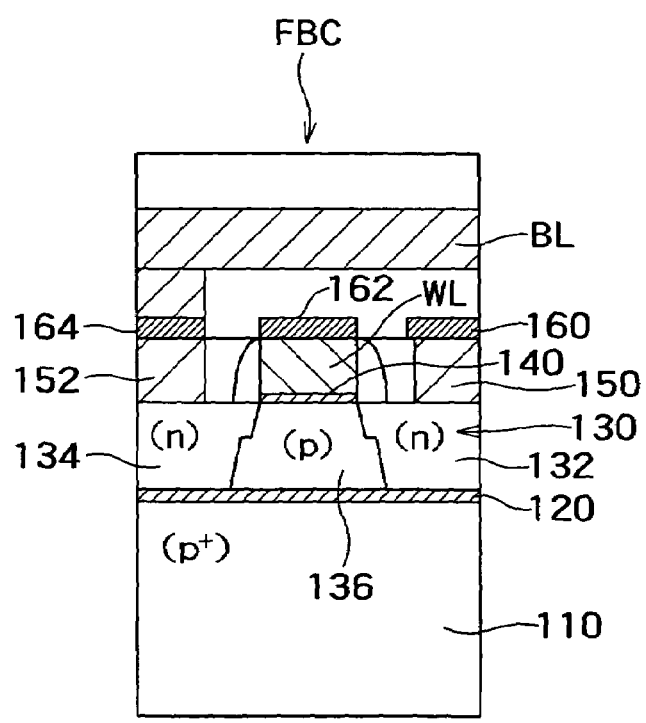
FIG. 2 is a cross-sectional view of a unit cell U taken along the A—A line of FIG. 1.
Figure 3A:
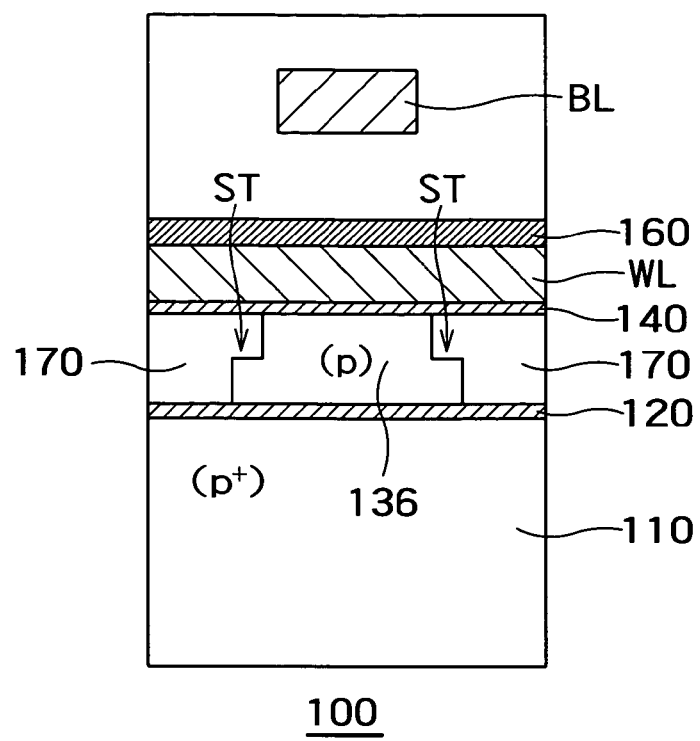
FIGS. 3A and 3B are a cross-sectional view of the unit cell U taken along the B—B line of FIG. 1 and a cross-sectional view of a peripheral logic circuit.
Figure 3B:
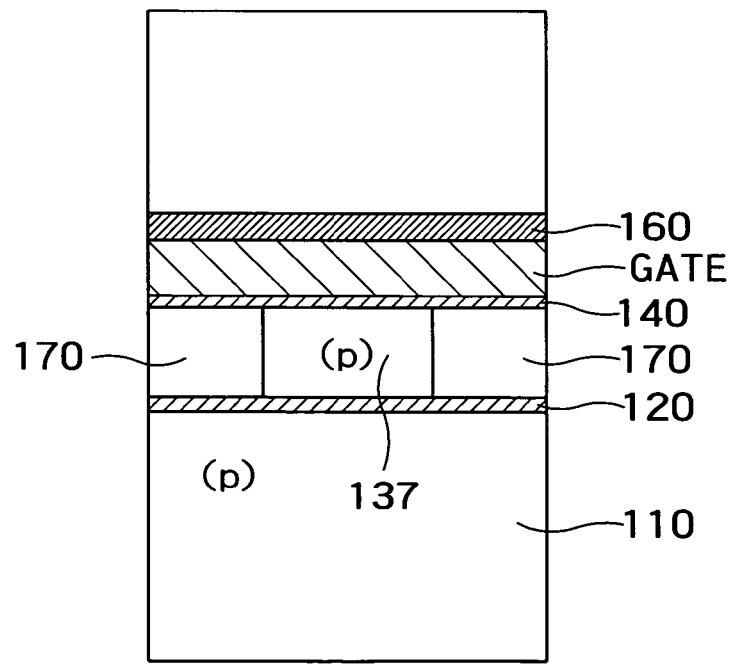

FIG. 2 is a cross-sectional view of a unit cell U taken along the A—A line of FIG. 1. Fig. 3A is a cross-sectional view of the unit cell U taken along the B—B line of FIG. 1, and FIG. 3B is a cross-sectional view of a peripheral logic circuit. First referring to FIG. 2, the DRAM 100 further includes a BOX layer 120, an SOI layer 130, and a p+type semiconductor substrate having impurity concentration equal to or higher than $10^{19}$ cm$^{-3}$. The BOX layer lies on the semiconductor substrate 110 and electrically insulates the SOI layer 130 from the semiconductor substrate 110. The semiconductor substrate 110 and the SOI layer 130 may be composed of single-crystalline silicon, and the BOX layer 120 may be made of $SiO_2$, for example.

The SOI layer 130 includes n-type source regions 132, n-type drain regions 134, and p-type body regions 136 each located between a source region 132 and a drain region 134. A gate insulating film 140 is provided on the body region 136, and word lines WL are provided on the gate insulating film 140. The gate insulating film 140 is made of $SiO_2$, for example. The word lines WL are insulated from the body regions 136 by the gate insulating film 140. Referring to FIG. 3A, STI (Shallow Trench Isolation) 170 is formed to confine the body regions 136 from front and back directions. The STI 170 is made of $SiO_2$ for example. As a result, the body regions 136 are each enclosed by the insulating material and the semiconductor material different in conduction type, and the body regions 136 are therefore held electrically floating. Thus, the potential of each body region 136 may vary depending upon the potentials of the semiconductor substrate 110, word line WL, source region 132 and drain region 134.

Thickness of the BOX layer 120 is one to five times the thickness of the gate insulating film 140. If the thickness of the gate insulating film 140 is 5 nm, thickness of the BOX layer 120 will be 5 nm to 25 nm.

Thickness of the body regions 136 is three times or less of the BOX layer. If the BOX layer is 25 nm thick, then the body regions are 75 nm thick or less.

The DRAM 100 further includes poly silicon plugs 150, 152, silicides 160, 162, 164. The poly silicon plugs 150 and the silicide 160 are electrically connected to the source regions 132 to serve as the source lines SL shown in FIG. 1. The silicide 162 covers top surfaces of the word lines WL to reduce the resistance of the word lines WL. The poly silicon plugs 152 and the silicide 164 make electrical connection between the drain regions 134 and the bit lines BL. Gaps between the word lines WL and bit lines BL as well as gaps between the word lines WL and the poly silicon plugs 150, 152 are buried with an insulator such as $SiO_2$ for example.

Still referring to FIG. 3A, the surface of each body region 136 in contact with the BOX layer 120 (this surface will be herein below referred to as the bottom surface) is wider in terms of the area than the surface thereof in contact with the gate insulating film 140 (this surface will be herein below referred to as the top surface). This is because each body regions 136 has step portions on its sidewalls in its cross-sectional view taken along a word line WL.

Thus, the capacitance value between the body region 136 and the semiconductor substrate 110 (herein below labeled Csub) goes larger than those in conventional techniques.

In this embodiment, thickness of the BOX layer 120 is one to five times the thickness of the gate insulating film 140, and moreover, the area of the bottom surface of the body region 136 is larger the area of the top surface thereof. In this manner, the instant embodiment can further increase the capacitance value Csub than conventional techniques.

In addition, since the impurity concentration at the boundary between the semiconductor substrate 110 and the BOX layer 120 in the DRAM region is not lower than $10^{19}$ $cm^{-3}$, the instant embodiment does not permit a depletion layer in the semiconductor substrate 110, or can diminish the thickness of the depletion layer. Therefore, the embodiment can raise the capacitance value Csub more than conventional techniques.

FIG. 3B shows a cross-sectional view of an N channel MOS transistor in a peripheral circuit or a logic circuit (herein below referred to as peripheral logic circuit). The body region 137 in the peripheral logic circuit does not have steps ST in its cross-sectional view along a gate electrode. More specifically, in the cross-sectional view taken along the gate electrode, surface of the body region of the peripheral logic circuit in contact with the BOX layer 120 is approximately equal to the area in contact with the gate insulating film 140. In this case, since the capacitance between the SOI layer and the semiconductor substrate 110 is reduced in the peripheral logic circuit region, the peripheral logic circuit is speeded up, and its power consumption decreases. In addition, conduction type of the semiconductor substrate 110 in the peripheral logic circuit region is the p-type, and the impurity concentration along the interface with the BOX layer is in the order of $10^{18}$ $cm^{-3}$ or less. Therefore, in case the potential of the drain region varies fast, the depletion layer grows thick, and the parasitic capacitance is small. In P-channel MOS transistors, conduction type of the semiconductor substrate 110 may be changed to the opposite type.

The body region 136 can store data by accumulating or discharging electric charges. For example, the word line WL and the bit line BL are set in relatively high potentials, and the FBC is biased to its saturated state. As a result, impact ionization occurs in the body region 136, and holes are accumulated in the body region 136. Thereby, data "1" is written in the FBC. The data state is designated as "1" when more holes are accumulated in the body region 136.

On the other hand, when the bit line BL is set in a relatively low potential and the word line WL is set in a relatively high potential, a pn junction between p-type body region 136 and n-type drain region 134 is biased forward. In this case, the holes heretofore accumulated in the body region 136 are discharged to the bit line BL through the drain region 134. As a result, data "0" is written in the FBC.

Figure 4:
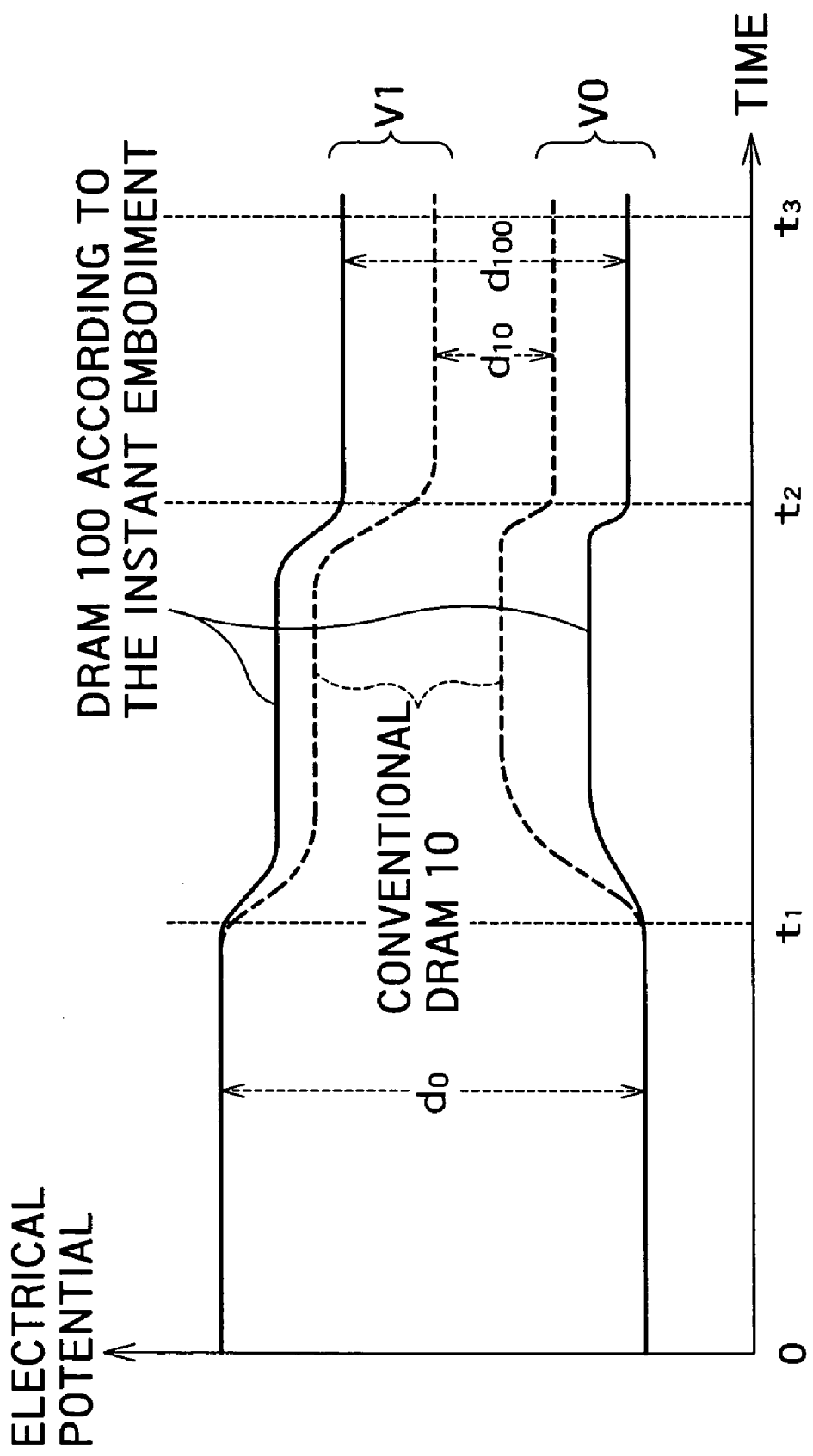
FIG. 4 is a graph showing body potentials when data is "1" and "0"

FIG. 4 is a graph showing body potentials when data is "1" and "0". The body potential when data is "1" is labeled V1, and the body potential when data is "0" is labeled V0.

The abscissa represents time. In time 0~t1, data "1" is written in the body region 136 by setting the word line WL and the bit line BL in the potential of 1.5 V, for example, and data "0" is written in the body region 136 by setting the potential of the word line WL in 1.5 V for example and the potential of the bit line BL in −1.5 V for example. At time t1, the bit line BL is returned to a hold state (for example, 0 V). At time t2, the word line WL is returned to a hold state (for example, −1.5 V). Among the curves represented by V1 and V0, the curves shown by broken lines exhibit body potentials of a conventional DRAM (named DRAM 10 for convenience) whereas the curves shown by solid lines represent body potentials of DRAM 100 according to the instant embodiment.

In the write time (0~t1), body potentials of DRAM 10 and DRAM 100 are substantially equal. At that time, the body potentials for data "1" and data "0" exhibit a large difference, and they can be readily distinguished.

When the bit line BL is returned to the hold state (t1~t2), V1 drops, and V0 rises. Therefore, the difference between the body potentials for data "1" and data "0" becomes smaller.

When the word line WL is returned to the hold state (t2~t3), V0 decreases and V1 decreases by a degree larger than the decrease of V0. Therefore, the difference between the body potentials for data "1" and data "0" becomes much smaller.

As shown in FIG. 4, in the conventional DRAM 10, the body potential difference $d_0$ between data "1" and data "0" at the time t1 decreases to the potential difference $d_{10}$ at the time t3. In the DRAM 100 according to the instant embodiment, the body potential difference $d_0$ decreases to the potential difference $d_{100}$ at the time t3. The potential difference $d_{100}$ in the DRAM 100 according to the instant embodiment is larger than the potential difference $d_{10}$ in the conventional DRAM 10. In general, a larger difference between V1 and V0 allows easier distinction between data "1" and data "0", and enhances the function yield. Therefore, DRAM 100 is easier to distinguish data "1" from data "0" than the conventional DRAM 10, and assures a better production yield.

This is because the area of the bottom surface of the body region 136 in the DRAM 100 is larger than the area of the top surface thereof, and the capacitance value Csub between the semiconductor substrate 110 and the body region 136 in the DRAM 100 is larger than the capacitance value Csub of the DRAM 10. These reasons are explained below in detail. Let Csub be the capacitance value between the semiconductor substrate 110 and the body region 136, Cd be the capacitance value between the drain region 134 and the body region 136, Cs be the capacitance value between the source region 132 and the body region 136, and Cg be the capacitance value between the word line WL and the body region 136. Then, the ratio of contribution of Csub to the body region is expressed as Csub/(Csub+Cd+Cs+Cg). Since the semiconductor substrate 110 is supplied with a negative fixed potential, large contribution of Csub to the body region leads to more stabilization of V1 and V0. Therefore, the larger the ratio R, i.e., the larger the Csub, V1 and V0 become more stable. As a result, even after the bit line BL and the word line WL are returned to their hold states (i.e. even after t1), the potential difference $d_{100}$ in the DRAM 100 can be maintained in a state nearer to the potential difference $d_0$. For example, in the write time (0~t1), potential difference between V1 and V0 is about 1.5 V. However, after the word line WL is returned to the hold state (i.e. after t1), difference between body potentials (V1−V0) becomes approximately 1.5V*(Csub/(Csub+Cd+Cs+Cg)).

If the ratio of contribution of Cd to the body region is large, when the bit line BL is returned to the hold state (t1~42), the body potential difference (V1−V0) between data "1" and data "0" largely decreases. For example, when the bit line BL decreases from 1.5 volt to 0 volt, V1 decreases by 1.5V*(Cd/(Csub+Cd+Cs+Cg), and V0 increases by 1.5V*(Cd/(Csub+Cd+Cs+Cg)). From these equations, it is expected that the body potential difference (V1−V0) increases when the SOI is formed thinner and Cd is reduced accordingly.

If the ratio of contribution of Cg to the body region is large, potential difference between data "1" and data "0" largely decreases when the word line WL is returned to the hold state (t2~t3). In this case, for example, V1 becomes lower than V0 by as much as 1.5V*(Cg/(Csub+Cd+Cs+Cg)). This is because the transistor varies in threshold voltage as much as 1.5 volt between data "1" and data "0", and the degree of the capacitance coupling between the word line WL and the body region 136 therefore varies as much as 1.5 volt. Further, from those equations, it is expected that the body potential difference (V1−V0) increases as the capacitance between the word line WL and the body region decreases.

Both the DRAM 10 and the DRAM 100 have an approximately 25 nm BOX layer. However, Csub of the DRAM 100 increases (to a double, for example) relative to Csub of the DRAM 10 due to the increase of the contact area by the step portions ST. Accordingly, the potential difference $d_{100}$ becomes larger than the potential difference $d_{10}$.

Let the above-mentioned capacitance value be estimated specifically. Assume here that the width of the device region in FIG. 1 is 100 nm, width of STI is 100 nm, and width of the word line WL is 100 nm. Let the impurity concentration of the body region 136 be $10^{18}$ cm$^{-3}$. In case the body region is 75 nm thick, Cd and Cs are 0.021 fF. Csub in the conventional DRAM 10 having the 25 nm thick BOX layer and no step portion ST is 0.014 fF. Capacitance of the depletion layer under the channel is 0.03 fF, capacitance of the gate insulating film is 0.069 fF, and Cg connecting them in series is 0.021 fF. If the step portion ST is formed by a 25 nm wide spacer, then the width of the body region along the BOX interface is 150 nm. Therefore, Csub can be increased to 1.5 times, namely, 0.021 fF. Apparently from these results, by controlling the body region in thickness to be three times or less of the BOX layer and controlling the BOX layer in thickness to be five times or less of the gate insulating film, contribution of Csub becomes dominant, and data "1" and data "0" can be readily distinguished. This results in realization of DRAM improved in function yield and capable of holding data for a longer time.

Figure 10:
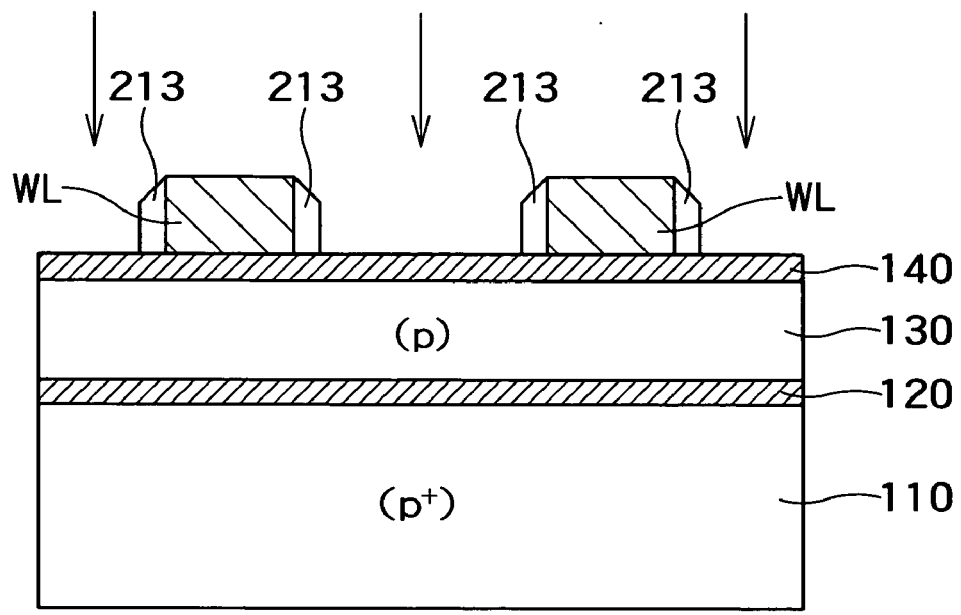
FIG. 10 is a diagram showing a step subsequent to FIG. 9 in the manufacturing method of the DRAM 100 in its cross-sectional view.
Figure 11:
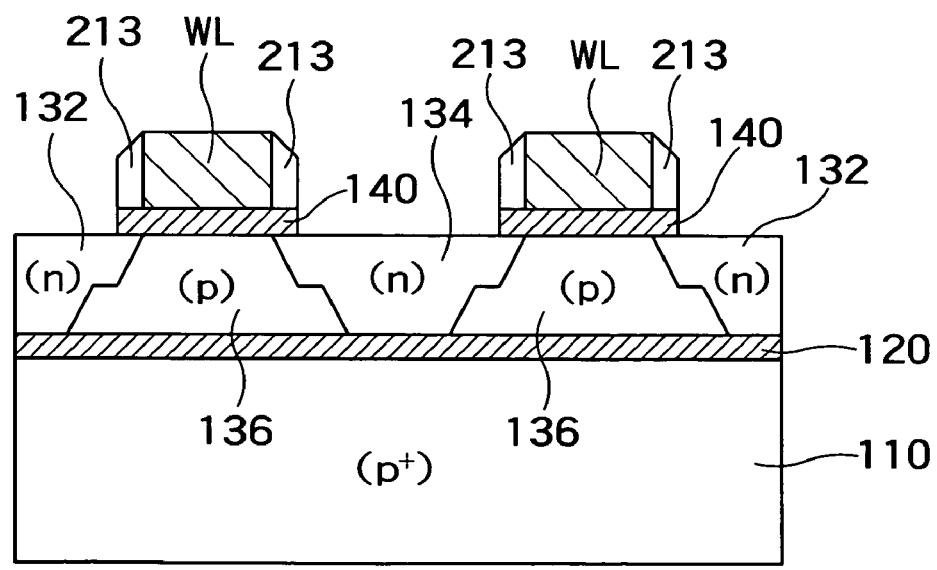
FIG. 11 is a diagram showing a step subsequent to FIG. 10 in the manufacturing method of the DRAM 100 in its cross-sectional view.
Figure 12:
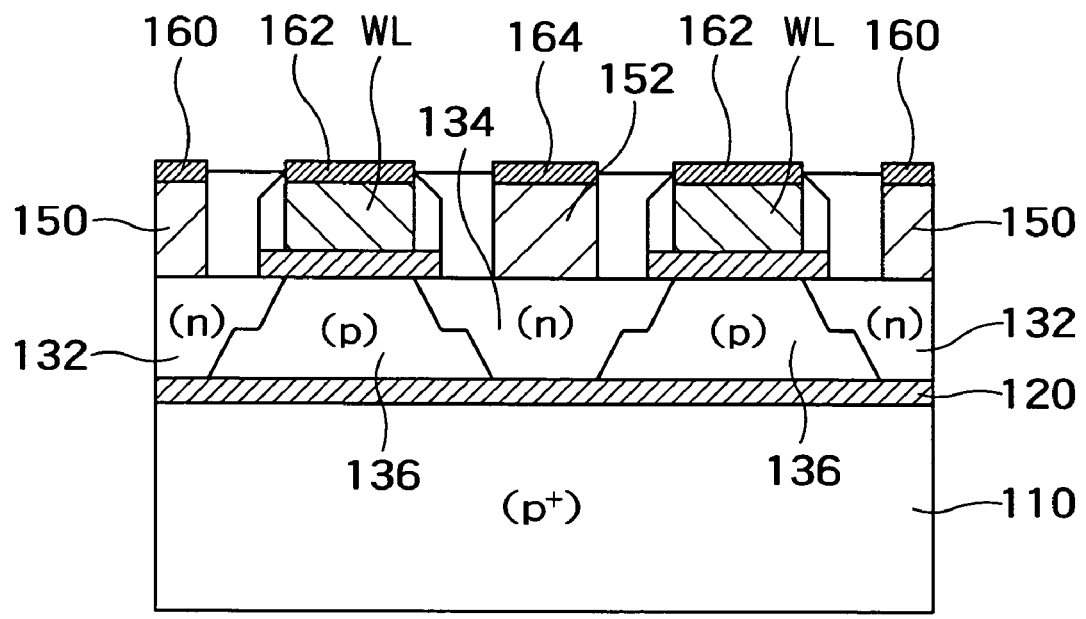
FIG. 12 is a diagram showing a step subsequent to FIG. 11 in the manufacturing method of the DRAM 100 in its cross-sectional view.

Next explained is a manufacturing method of DRAM 100. FIGS. 5 through 12 show the manufacturing process in cross-sectional views of the DRAM 100 in the order of steps. Among them, FIGS. 5 through 9 are cross-sectional views taken along a word line WL, and FIGS. 10 through 12 are cross-sectional views taken along a bit line BL.

Figure 5:
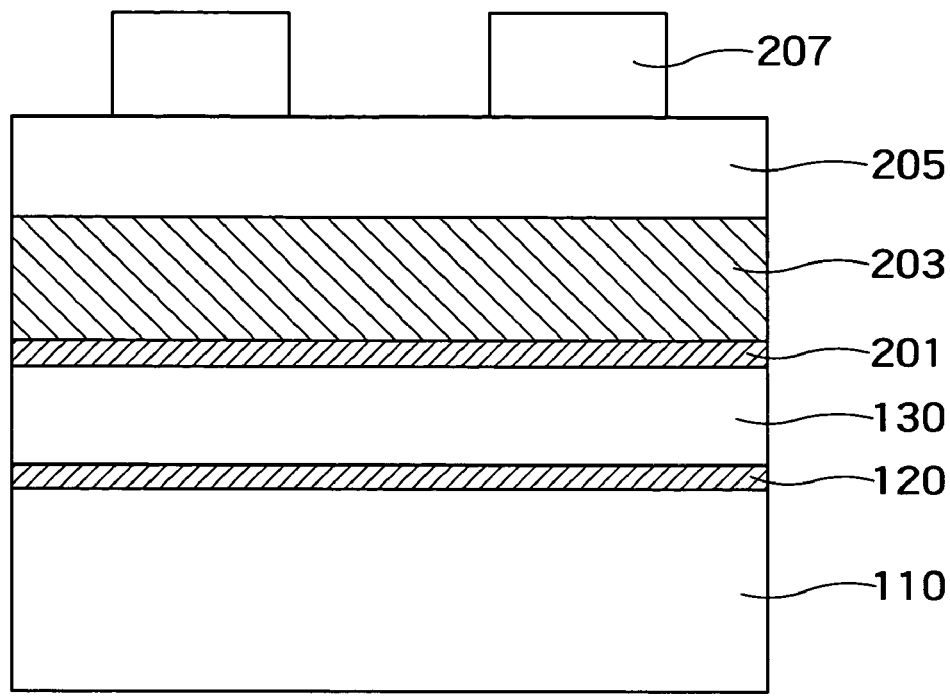
FIG. 5 is a diagram showing a step of a manufacturing method of a DRAM 100 in its cross-sectional view.

As shown in FIG. 5, first prepared is an SOI substrate including a semiconductor substrate 110, BOX layer 120 and SOI layer 130. The top surface of the SOI layer 130 is oxidized to form a silicon oxide film 201. Thickness of the BOX layer 120 is approximately 25 nm. After that, using CVD for example, a silicon nitride film 203 is deposited on the silicon oxide film 201, and a silicon oxide film 205 is further deposited on the silicon nitride film 203. Thereafter, resist 207 is coated on the silicon oxide film 205, and then patterned by photolithography.

Figure 6:
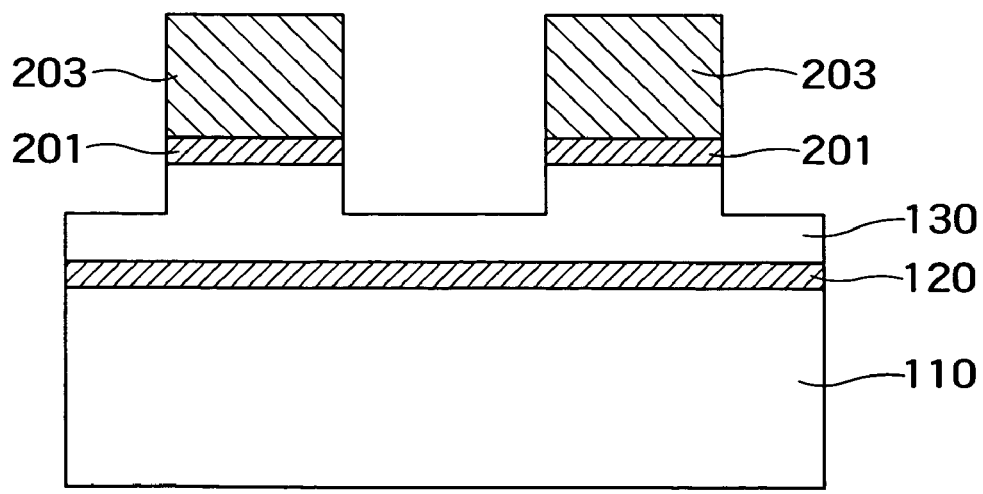
FIG. 6 is a diagram showing a step subsequent to FIG. 5 in the manufacturing method of the DRAM 100 in its cross-sectional view.

As shown in FIG. 6, using the resist 207 as a mask, the silicon oxide film 205 is etched by RIE, for example. Next using the patterned silicon oxide film 205 as a mask, the silicon nitride film 203 is etched by RIE for example. Furthermore, using the silicon nitride film 203 as a mask, the silicon oxide film 201 and the SOI layer 130 are etched sequentially. Here is used anisotropic etching, and it is conducted until reaching halfway of the thickness of the SOI layer 130. Thereby, while the lower part of the SOI layer 130 is maintained, the upper part of the SOI layer 130 is removed by anisotropic etching.

Figure 7A:
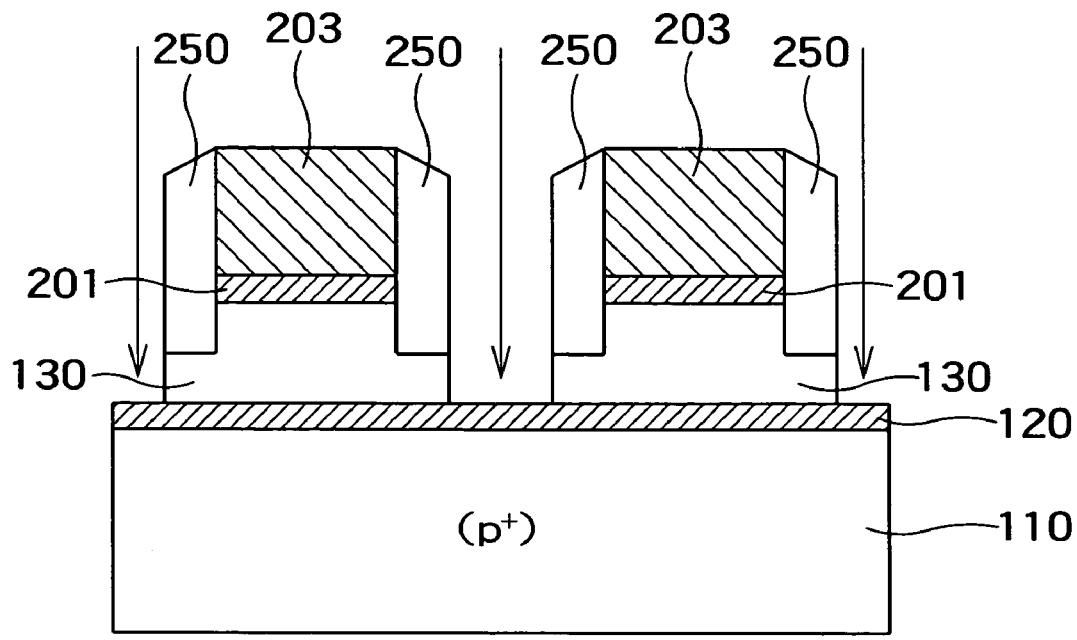
FIGS. 7A and 7B are a diagram showing a step subsequent to FIG. 6 in the manufacturing method of the DRAM 100 in its cross-sectional view, and a cross-sectional view of the peripheral logic circuit region in this step.

As shown in FIG. 7A, spacer 250 is next formed to cover side walls of the silicon nitride film 203, silicon oxide film 201 and the upper part of the SOI layer 130. The spacer 250 may be a silicon oxide film or a silicon nitride film, for example. After that, using the silicon nitride film 203 and the spacer 250 as a mask, the SOI layer 130 is etched by RIE or the like. As a result, the BOX layer 120 is exposed between adjacent portions of the lower part of the SOI layer 130. After that, impurity ions are injected in an energy level permitting the ions to penetrate the exposed BOX layer 120 but not permitting them to penetrate the silicon nitride film 203. As a result, the impurity is injected into the semiconductor substrate 110, and the conduction type of the semiconductor substrate 110 is determined. In this embodiment, boron or indium, for example, is used as the impurity for ion injection, and the semiconductor substrate 110 is formed as a p-type semiconductor. The p-type diffusion layer is formed to extend to outside the memory cell array, and a potential is applied to the semiconductor substrate 110 by a contact connected to the p-type diffusion layer.

Figure 7B:
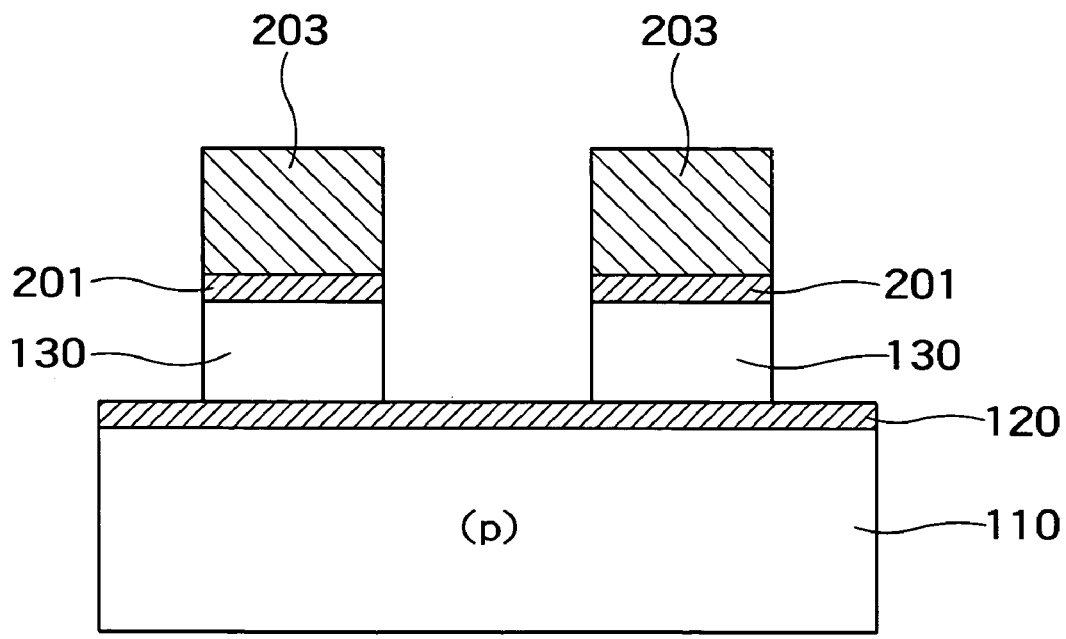

FIG. 7B is a cross-sectional view of the peripheral logic circuit in this step. In the region of the peripheral logic circuit, no spacers preferably exist. For this purpose, after the spacer is once formed in both the DRAM region and the peripheral logic circuit region, a photolithographic step and an etching step are added. That is, while the DRAM region is covered by photo resist, the spacer in the region of the peripheral logic circuit is removed by etching. As a result, the device region in the peripheral logic circuit region is patterned using the silicon nitride film 203 as a mask as shown in FIG. 7B, and no steps ST are formed therein. In this process, injection of high-concentrated impurity ions into the semiconductor substrate 110 in the peripheral logic circuit region is not performed so as not to increase the parasitic capacitance.

Figure 8:
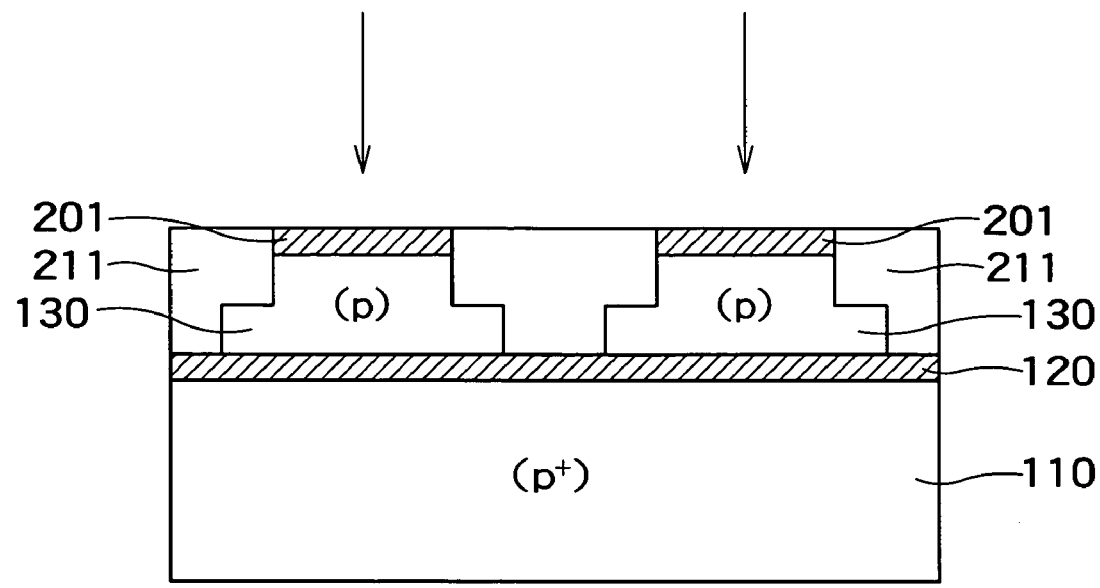
FIG. 8 is a diagram showing a step subsequent to FIG. 7B in the manufacturing method of the DRAM 100 in its cross-sectional view.

As shown in FIG. 8, the spacer 250 is next removed, and a silicon oxide film 211 is deposited between adjacent portion of the SOI layer 130 by CVD or the like. Thereafter, the silicon oxide film 211 and the silicon nitride film 203 are removed by CMP or the like to smooth the top surface. Then, a p-type impurity is injected into the SOI layer 130 to determine the threshold voltage.

Figure 9:
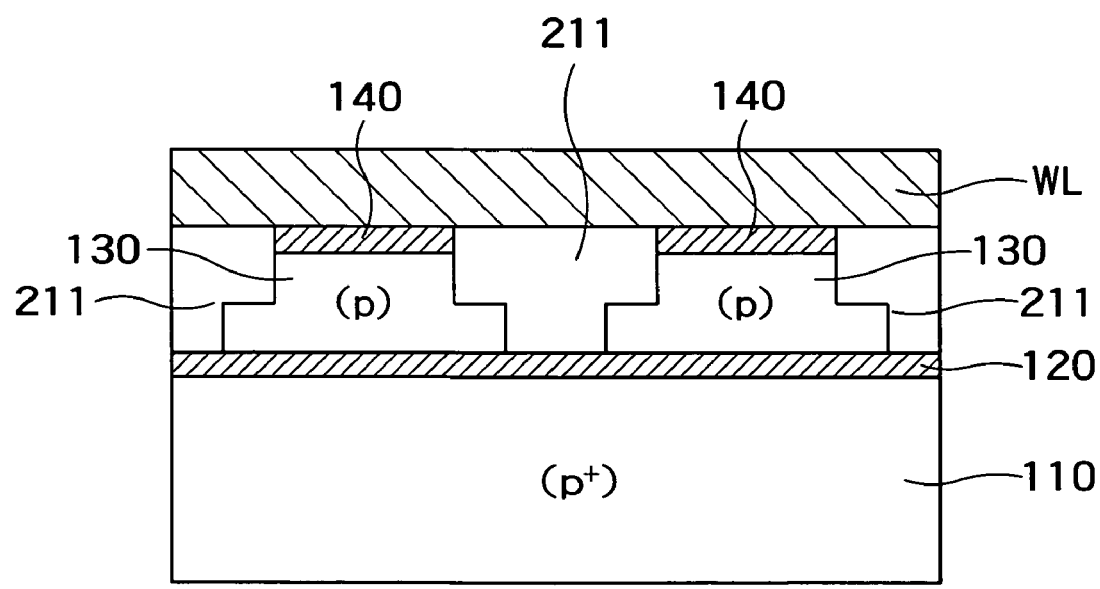
FIG. 9 is a diagram showing a step subsequent to FIG. 8 in the manufacturing method of the DRAM 100 in its cross-sectional view.

As shown in FIG. 9, the silicon oxide film 201 is removed, and a gate insulating film 140 is formed on the SOI layer 130. Thickness of the gate insulating film 140 is approximately 5 nm. Therefore, thickness of the BOX layer 120 is about five times the thickness of the gate insulating film 140. Furthermore, word lines WL are formed on the gate insulating film 140 by photolithography and RIE, or another appropriate etching technique. The word lines WL are formed to extend across the stripes of the SOI layer 130 when viewed from above the top surface of the semiconductor substrate 110. The word lines WL are made of poly silicon, for example.

As shown in FIG. 10, impurity ions are injected into the SOI layer 130 in self-alignment via the word lines WL as a mask. As a result, lightly doped drains in the order of $10^{18}$ $cm^{-3}$ are formed. Thereafter, spacer 213 is formed to cover the side surfaces of the word lines WL. The spacer 213 may be a silicon oxide film or a silicon nitride film for example. Furthermore, using the word lines WL and the spacer 213 as a mask, impurity ions are injected into the SOI layer 130 in self-alignment. In the instant embodiment, phosphorus or arsenic ions are injected into the SOI layer 130.

As a result, as shown in FIG. 11, source regions 132 and drain regions 134 are completed, and body regions 136 are formed between the source regions 132 and the drain regions 134.

As shown in FIG. 12, poly silicon plugs 150 and 152 are next formed on the source regions 132 and the drain regions 134, respectively. In the peripheral circuit region, however, no poly silicon plugs are formed. After that, a metal is deposited on the top surfaces of the poly silicon plugs 150, 152 and the word lines WL to form silicide layers 160, 162 and 164. The silicide layers 160, 162, 164 may be a cobalt silicide, for example.

After that, an insulation film is deposited on the silicide layers 160, 162, 164 followed by formation of plugs in the insulation film electrically connected to the silicide layer 164 and the poly silicon plug 152. In addition, bit lines BL are formed on the plugs to intersect with the word lines WL approximately at a right angle. The bit lines BL may be a metal such as copper, aluminum or tungsten, for example. Through these steps, the DRAM 100 shown in FIGS. 1 through 3B is completed.

Figure 13:
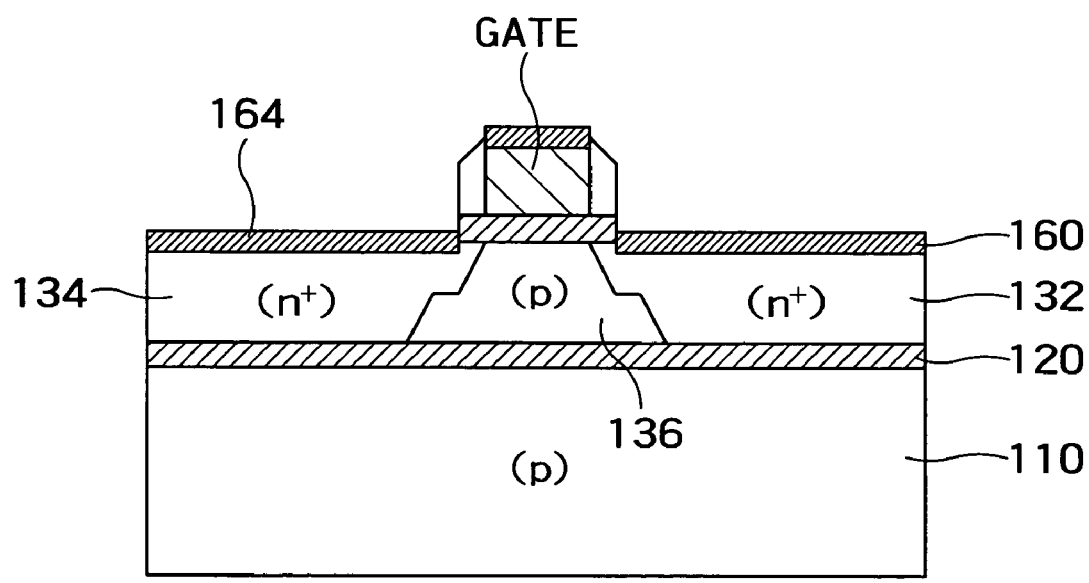
FIG. 13 is a cross-sectional view of the peripheral circuit of the DRAM 100.

In case a peripheral circuit is formed around the DRAM 100, transistors forming the peripheral circuit have the configuration shown in FIG. 13 in cross section. Body regions 136 in transistors of the peripheral circuit portion need not be electrically floating.

Figure 14:
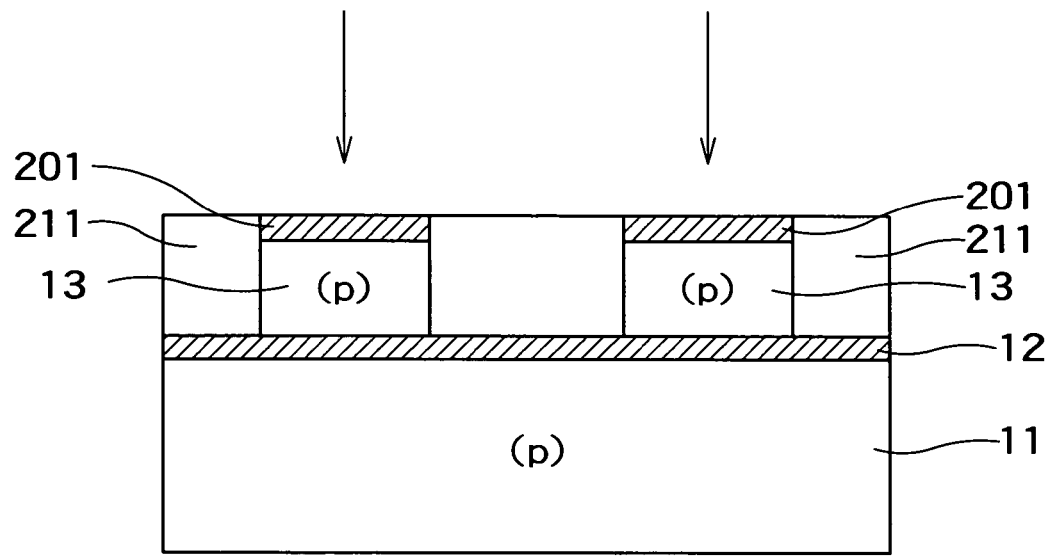
FIG. 14 is a diagram showing a step of a manufacturing method of a conventional DRAM 10.

The conventional manufacturing method conducted ion injection to the semiconductor substrate 110 in the same step as FIG. 8 as shown in FIG. 14. In the conventional manufacturing method, however, if the BOX layer 12 is thin, then the impurities to be injected to the semiconductor substrate 11 will be injected also to the SOI layer 13. That is, the conventional method could not determine the surface concentration of the semiconductor substrate 11 independently from the concentration of the SOI layer 13. Concentration of the body regions of the SOI layer 13 must be limited not to exceed $10^{18}$ $cm^{-3}$ approximately to prevent PN junction leakage current. Therefore, the surface concentration of the semiconductor substrate 11 needs to be around $10^{18}$ $cm^{-3}$, and this results in producing a depletion layer in the semiconductor substrate 11. Therefore, the conventional method could not increase the capacitance value Csub.

In contrast, the instant embodiment executed ion injection into the semiconductor substrate 110 after the etching of the SOI layer 130 as shown in FIG. 7A. Therefore, no impurities are injected to the 501 layer 130, and the surface of the semiconductor substrate 110 can be doped with a sufficiently high concentration of impurity to thereby increase the capacitance value Csub. Injection of the impurity into the 501 layer 130 in the instant embodiment can be attained in the same manner as the conventional technique. Therefore, impurity concentration of the semiconductor substrate 110 and impurity concentration of the SOI layer 130 can be determined independently from each other. Therefore, it is possible to design a memory cell enhanced in body potential difference (V1–V0) and elongated in data retention time.

Second Embodiment

Figure 15:
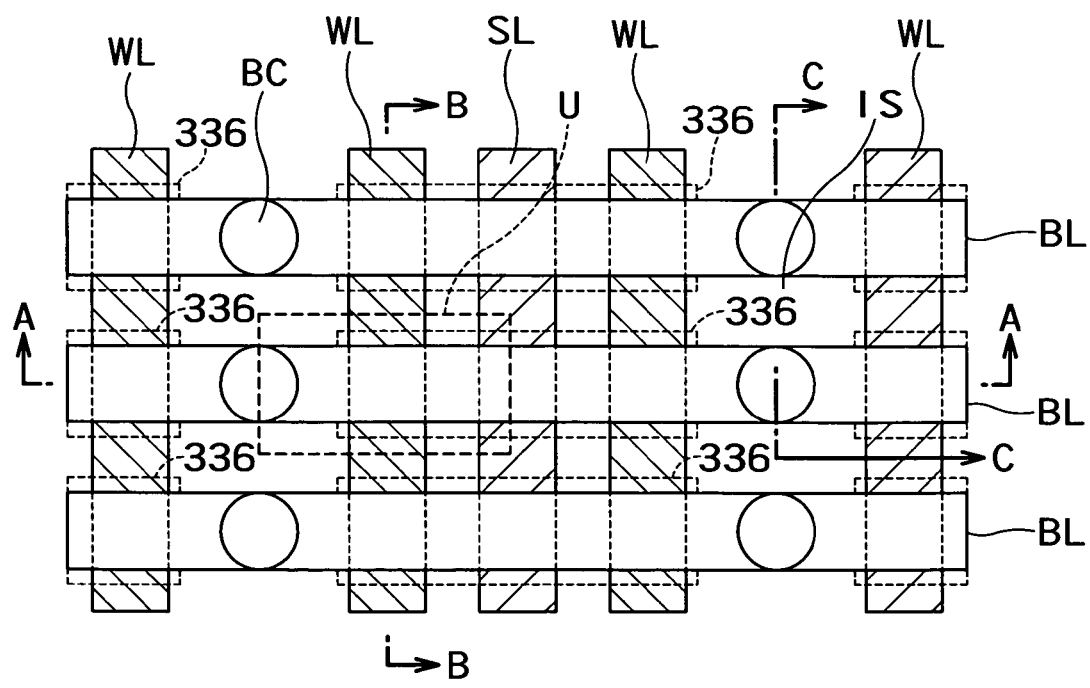
FIG. 15 is a plan view of a DRAM 300 according to the second embodiment of the invention.

FIG. 15 is a plan view of DRAM 300 according to the second embodiment of the invention. Configuration of body regions 336 of the second embodiment is different from that of the body regions 136 in the first embodiment. The body regions 336 do not have steps ST (see FIG. 3A) on their sidewalls in the regions corresponding to bit line contacts BC. In the other regions not corresponding to the bit line contacts BC, the body regions 336 have steps on their sidewalls. The other components of the second embodiment may be identical to corresponding components of the first embodiment.

A cross-sectional view of a unit cell U shown in FIG. 15 taken along a bit line (A—A line) appears identically to FIG. 2, and a cross-sectional of the unit cell U taken along a word line WL (B—B line) appears identically to FIG. 3A. However, a cross-sectional view taken along a portion of bit line contacts BC (C—C line) appears differently from the first embodiment.

Figure 16:
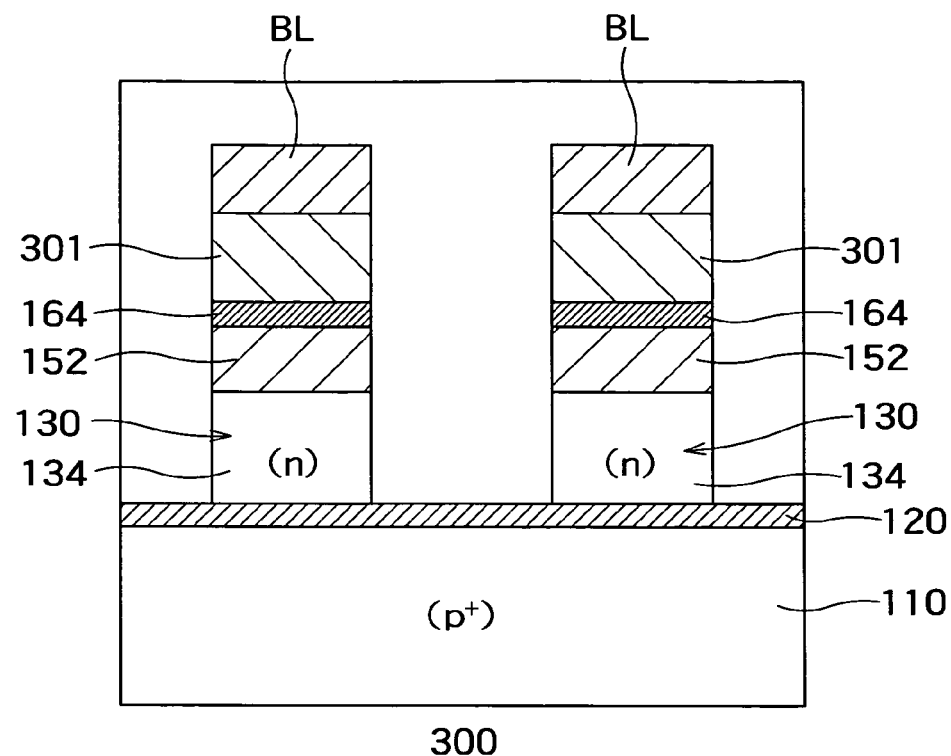
FIG. 16 is a cross-sectional view taken along the C—C line passing the portion of bit line contacts BC.

FIG. 16 is the cross-sectional view taken along the C—C line in the portion of bit line contacts BC. Sidewalls of the SOI layer 130 do not have steps. In this cross-sectional view, the SOI layer 130 corresponds to the drain region 134.

According to this embodiment, the capacitance value between the bit line BL and the semiconductor substrate 110 decreases. As a result, the DRAM 300 can drive faster than the DRAM 100.

Next explained is a manufacturing method of DRAM 300. The method may be the same as the manufacturing method of DRAM 100 up to removal of the spacer 250 in FIG. 8. After that, here are added a photolithographic step and an etching step. In the photolithographic step, a photo resist is formed in regions PR shown in FIG. 17. That is, in this photolithographic step, the photo resist is patterned to cover regions along the word lines WL between adjacent bit line contacts BC. Subsequently, step portions ST in the region not covered by the photo resist (region PR) are etched. Thereafter, through the same steps as those of the first embodiment, DRAM 300 is completed. The manufacturing method of DRAM 300 has the same effects as those of the manufacturing method of DRAM 100 as well.

Additionally, another manufacturing method of DRAM 300 is explained. This method is identical to the manufacturing method of DRAM 100 up to the step of anisotropic etching of the upper part of the SOI layer 130 while maintaining the lower part thereof in FIG. 6. Next formed is a photo resist having the pattern PR (see FIG. 17) in the DRAM region and filly open in the peripheral logic circuit. After that, the SOI layer 130 is selectively etched by using the photo resist and the silicon nitride film 203 as a mask. As a result, the BOX layer in the STI regions near the drain regions of the DRAM 300 and the BOX layer 120 in the STI regions in the peripheral logic circuit region are exposed. Thereafter, a spacer material is deposited on the substrate. Then, a photo resist fully opened in the DRAM region is formed, and the spacer material is selectively removed by anisotropic etching by RIE or the like to obtain the spacer 250 (FIG. 7). Then, using the silicon nitride film 203 and the spacer 250 as a mask, the SOI layer 130 is selectively removed by RIE to expose the BOX layer 120 of the STI regions in the DRAM region. Thus, step portions ST corresponding to the thickness of the spacer 250 are formed in the body regions 136 and the source regions 132 (see FIG. 1) only in the DRAM region. After the spacer 250 is removed, the same steps as those of the first embodiment (see FIGS. 8 through 12) may be conducted. As explained above, DRAM 300 can be manufactured.

Figure 17:
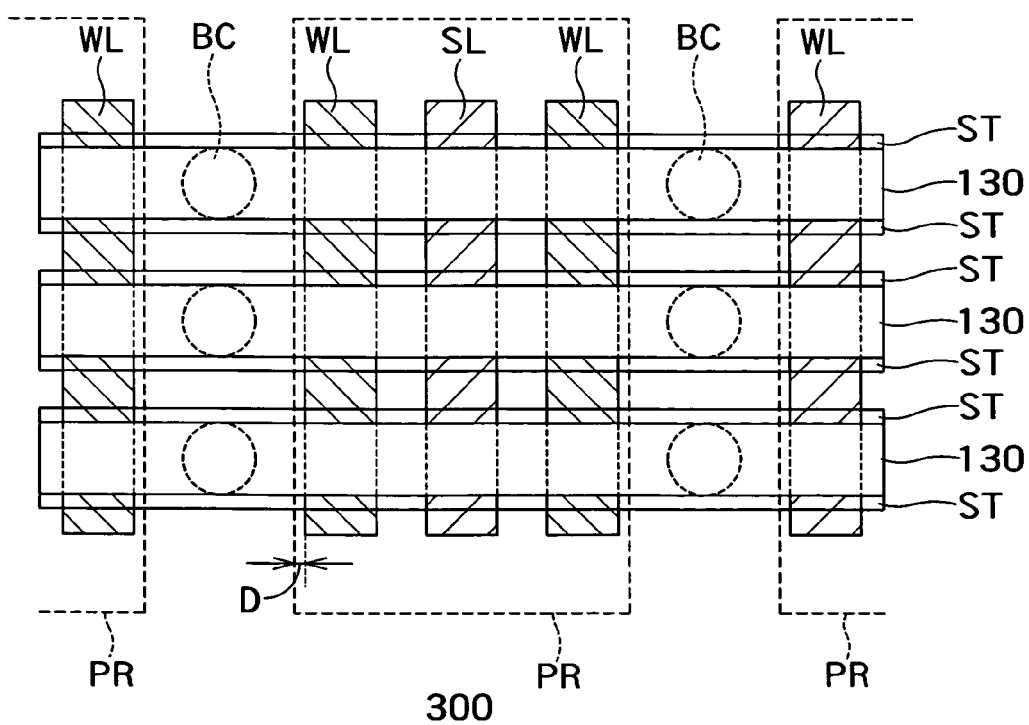
FIG. 17 is a diagram showing an intermediate step of the manufacturing method of the DRAM 300 in its plan view.

As shown in FIG. 17, distance D between an edge of each word line WL and an edge of a pattern PR in the DRAM 300 may be adjustable appropriately. For example, step portions ST near the n-type drain regions may be fully removed by reducing the distance D to zero. In this case, the area of the PN junction between each n-type drain region and each p-type body region is smaller than that of the DRAM 100. As a result, because the value of Cd is smaller than that of the DRAM 100, distinction between data "1" and data "0" is easier in the DRAM 300 than in DRAM 100. Therefore, DRAM 300 is better in function yield and can hold data for a longer time. Furthermore, in the DRAM 300, although the value of Cd is approximately equal to that of the conventional DRAM 10, values of Csub and Cs are larger. The body potential difference (V1−V0) after the word line WL returns to its hold state can be expressed as approximately 1.5V* ((Csub+Cs−Cd)/(Csub+Cd+Cs+Cg)). As compared with the first embodiment where Cd=Cs, DRAM 300 according to this embodiment exhibits a larger value of Cs than Cd, and this effect also contributes to easier distinction between data "1" and data "0", better function yield and longer data retention time.

What is claimed is:

1. A semiconductor device comprising:
   a semiconductor substrate;
   a first insulation layer formed on the semiconductor substrate;
   a semiconductor layer insulated from the semiconductor substrate by the insulation layer;
   a source region of a first conduction type and a drain region of the first conduction type formed in the semiconductor layer;
   a body region of a second conduction type formed in the semiconductor layer between the source region and the drain region, said body region being capable of storing data by accumulating or releasing electric charge;
   a second insulation layer formed on the body region;
   a word line formed on the second insulation layer and insulated from the body region by the second insulation layer; and
   a bit line electrically connected to the drain region,
   wherein in a cross-section of the semiconductor device taken in a direction extending along and approximately parallel to the word line, a length of a boundary between the body region and the first insulation layer is larger than a length of a boundary between the body region and the second insulation layer, and
   the body region has steps on sides of the body region, the sides facing toward a direction extending along and approximately parallel to the word line.

2. The semiconductor device according to claim 1, wherein the first insulation layer has a thickness equal to or less than five times the thickness of the second insulation layer.

3. The semiconductor device according to claim 1 further comprising:
   a DRAM region including a DRAM having the body region as a part of a memory cell; and
   a peripheral logic circuit formed in the semiconductor layer insulated from the semiconductor substrate by the insulation layer and formed around the DRAM region.

4. The semiconductor device according to claim 3, wherein a transistor used in the peripheral logic circuit includes:
   a source region of the first conduction type and a drain region of the first conduction type both formed in the semiconductor layer;
   a body region of the second conduction type formed between the source region and the drain region in the semiconductor layer;
   a third insulation layer formed on the body region; and
   a gate electrode formed on the third insulation layer and insulated from the body region by the third insulation layer,
   wherein a length of a boundary between the body region and the first insulation layer is approximately equal to a length of a boundary between the body region and the third insulation layer when viewed in a cross-section of the semiconductor device taken in a direction extending along and approximately parallel to the word line.

5. The semiconductor device according to claim 3, wherein the impurity concentration at the interface between the semiconductor substrate and the first insulation layer in the DRAM region is higher than the impurity concentration at the interface between the semiconductor substrate and the first insulation layer in the peripheral logic circuit region.

* * * * *